United States Patent [19]

Takeuchi

[11] Patent Number: 4,616,401
[45] Date of Patent: Oct. 14, 1986

[54] METHOD OF FABRICATING AN INSULATED GATE TYPE FIELD-EFFECT TRANSISTOR

[75] Inventor: Hiroshi Takeuchi, Chigasaki, Japan

[73] Assignee: Kabushiki Kaisha Toshiba, Kawasaki, Japan

[21] Appl. No.: 690,302

[22] Filed: Jan. 10, 1985

[30] Foreign Application Priority Data

Jun. 19, 1984 [JP]  Japan .................... 59-126175

[51] Int. Cl.⁴ ............... H01L 21/425; H01L 21/445
[52] U.S. Cl. .................................... 29/571; 29/576 B; 29/576 W; 29/591; 148/187
[58] Field of Search ............. 29/571, 576 W, 576 B, 29/591; 148/187

[56] References Cited

U.S. PATENT DOCUMENTS

| | | | |
|---|---|---|---|
| 4,016,594 | 4/1977 | Shappir | 357/41 |
| 4,330,931 | 5/1982 | Liu | 29/571 |
| 4,441,247 | 4/1984 | Gargini et al. | 29/576 B |
| 4,506,434 | 3/1985 | Ogawa et al. | 29/571 |
| 4,510,670 | 4/1985 | Schwabe et al. | 29/571 |
| 4,512,073 | 4/1985 | Hsu | 29/571 |
| 4,521,952 | 6/1985 | Riseman | 29/571 X |

FOREIGN PATENT DOCUMENTS 0090318 5/1983 European Pat. Off. .
57-76833 5/1982 Japan .

OTHER PUBLICATIONS

IBM Technical Disclosure Bulletin, vol. 21, No. 3, Aug., 1978, pp. 1250–1251, New York, US: V. L. Rideout "Fabricating Low Resistance Interconnection Lines and FET Gates in a Single Step", p. 1251, last two paragraphs.
Applied Physics Letters, vol. 44, No. 12, Jun. 15th, 1984, pp. 1139–1141, New York, US; W. A. Metz et al.: "Electrical Properties of Selectively Deposited Tungsten Thin Film", p. 1139, paragraphs 2,5.

*Primary Examiner*—George T. Ozaki
*Attorney, Agent, or Firm*—Oblon, Fisher, Spivak, McClelland & Maier

[57] ABSTRACT

A method of fabricating a MOS device is disclosed, in which, after formation of a gate electrode and source, drain regions, conductive material films are formed by selective CVD on the exposed surfaces of the gate electrode and source, drain regions. The conditions of the selective CVD are set such that the conductive material films formed on the source and drain regions partly overlay over the field insulating film adjacent to and surrounding the source and drain regions.

4 Claims, 13 Drawing Figures

METHOD OF FABRICATING AN INSULATED GATE TYPE FIELD-EFFECT TRANSISTOR

BACKGROUND OF THE INVENTION

This invention relates to a method of fabricating an insulated gate type field-effect transistor (IG-FET) having excellent element characteristics and high reliability.

Heretofore, there have been attempts to reduce the size of integrated circuit (IC) devices based on scaling rules in order to improve the characteristics and to increase the integration density of the devices. For example, a high performance MOS device can be obtained by reducing the size of various parts, increasing the impurity concentration of the channel region and reducing the supply voltage.

In actual practice, however, a high performance and high integration density IC device cannot be realized by merely proportionally reducing the size of an electrode and interconnection layer, and depth of a doped region and thickness of an insulating film between different interconnection layers. Along with the proportional size reduction, the patterning precision and alignment precision of many circuit elements have to be improved. For example, 64- and 256-kbit MOS dynamic random access memories (MOS-dRAM) require patterning precision and alignment precision of approximately 0.2 $\mu$m for a minimum pattern size of 2 to 3 $\mu$m. Where the minimun size is 1 $\mu$m or below, the necessary precision values are 0.1 $\mu$m or below.

To cope with these problems, recently, there is a trend of employing dry etching in lieu of wet etching as techniques for improving the patterning precision. Particularly, a precision of 0.1 $\mu$m now can be attained using reactive-ion-etching (RIE) which is a directional dry etching process. Meanwhile, the alignment precision depends on the precision of the alignment machines, so that it is difficult to secure precision below 0.1 $\mu$m.

If sufficient alignment prevision cannot be obtained when fabricating a MOS device by utilizing fine processing techniques, the following problems will arise.

Firstly, the contact resistance between the source, drain regions and interconnection layers in contact therewith is increased. This is so because the contact area of the interconnection layer is made very small if a contact hole, which is essentially small in a sectional area, deviates from the source or drain region even slightly and overlays over the field region. If such a resistance increase occurs, it will lead to deterioration of the MOS device. Secondly, if a contact hole is deviated and gets out of the source or drain region even slightly due to an alignment error, a possible overetching at the time of the contact hole formation will reduce the thickness of the field insulating film adjacent to the source or drain region. As a result, it is liable that the interconnection layer of aluminum or the like penetrates the pn junction of the source or drain region, thus resulting in a junction defect. This will extremely reduce the reliability of the MOS device.

SUMMARY OF THE INVENTION

An object of the invention is to provide a method of fabricating a IG-FET, which permits both integration density increase and reliability improvement of the IG-FET by increasing the redundancy of alignment of very fine patterns.

To attain the above object, the invention conductive material films are formed by selective chemical-vapor deposition (CVD) on the exposed surfaces of the gate electrode on the substrate as well as the source and drain regions formed therein. The conditions of the selective CVD are set such that the conductive material films formed on the source and drain regions partly overlay over the field insulating film adjacent to and surrounding the source and drain regions. Subsequent to the selective CVD step, an insulating film is deposition-formed on the wafer surface, and contact holes are formed in this insulating film. Interconnection layers are subsequently formed such that there are connected to the conductive material films through the contact holes.

BRIEF DESCRIPTION OF THE DRAWINGS

FIGS. 1A through 1I are sectional views illustrating an embodiment of the process of fabricating an n-channel MOS device according to the invention;

DETAILED DESCRIPTION OF THE PREFERRED EMBODIMENT

Now, an embodiment of the invention will be described in detail with reference to FIGS. 1A to 1I.

Figure 1A:
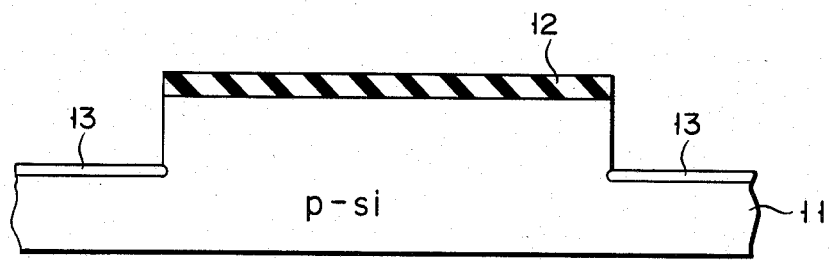

As shown in FIG. 1A, an etching-resistant ion-implantation-resistant masking member 12 is formed on an element formation region (SDG region) of a P-Si substrate 11 with a surface orientation (100) and a resistivity of 5 to 10$\Omega$-cm. The masking member 12 is, for instance, a silicon dioxide ($SiO_2$) film with a thickness of 0.4 $\mu$m formed by thermal oxidation. With the masking member 12 as a mask, the substrate 11 is etched to a depth of approximately 0.6 $\mu$m by RIE, thus forming a groove in a field region. A p-type dopant, e.g., boron ions ($B^+$), is implanted in the bottom of the groove of the field region with an accelerating voltage of 50 keV and a doping level of $1 \times 10^{13}$ /$cm^2$, thus forming a channel stopper 13. Subsequently, the masking member 12 is removed.

Figure 1B:
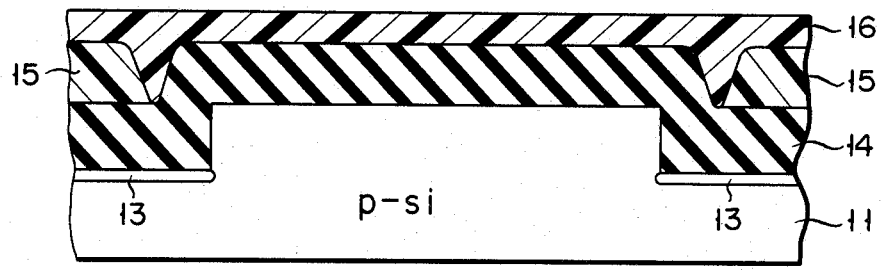

Then, a $SiO_2$ film is deposited as an insulating film 14 by CVD to a thickness of approximately 0.6 $\mu$m or above on the entire surface of the substrate 11, as shown in FIG. 1B. The CVD insulating film 14 is excellent in the step coverage, and is deposited to faithfully reflect the stepped surface of the substrate 11. A resist film 15 is then selectively formed as a spacer by a well-known photo-engraving process on the recessed portion of the insulating film 14. Then a mixture resist film 16, which consists of a PMAH (poly-methacrylic anhydride) resist for electron beam exposure and a positive photoresist, is spin-coated as a fluid material film over the entire wafer surface. The surface of the substrate 11 covered by the resist films 15 and 16, and insulating film 14 thus is made flat.

Figure 1C:
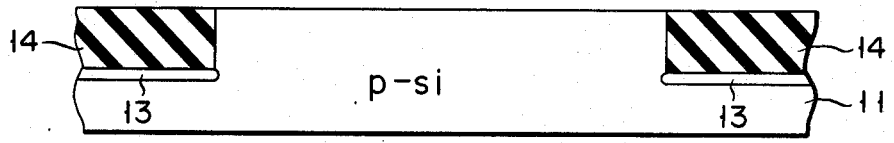

Thereafter, the entire wafer surface is etched by RIE using a carbon fluoride gas such as $CF_4$, $C_2F_6$ or $C_3F_8$. In this etching step, the rate of etching of the insulating film 14 is set to be equal to or higher than (e.g., about double) that of the mixture resist film 16 and resist film 15. With the selection of this etching condition, the resist film 15 serves as a stopper against etching in the field region. The etching is carried out until the surface of the SDG (source, drain and gate) region of the substrate 11 is exposed, and then the remaining resist film is removed. In consequence, a flat structure with the insulating film 14 buried in the field region, as shown in FIG. 1C, is obtained.

Figure 1D:
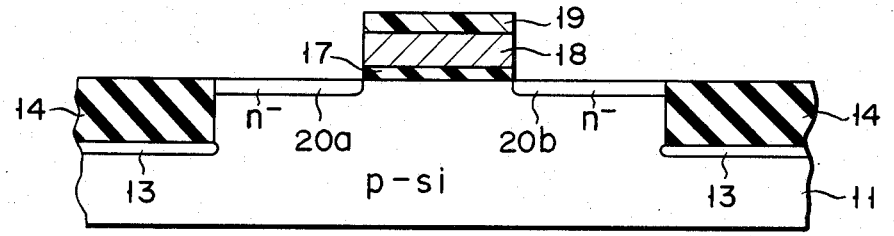

A gate electrode 18 is formed via a gate insulating film 17 of approximately 250 Å on the SDG region of the substrate 11 as shown in FIG. 1D. The gate insulating film 17 may be formed by thermal oxidation in a dry atmosphere. The gate electrode 18 consists of a doped polysilicon film of approximately 4,000 Å. The doped polysilicon film is formed, after the formation of the gate insulating film 17, by CVD on the entire wafer surface and then patterned by selective etching using a masking member 19. The masking member 19 is an ordinary resist film formed by PEP (photo-engraving process). The etching of the polysilicon film is carried out by RIE using a gas containing chlorine (Cl), e.g., CCl$_4$, BCl$_3$ Cl$_2$. In the presence of the masking member 19 an n-type dopant, e.g., arsenic ions (As$^+$), is implanted to form lightly doped n$^-$-type layers 20a and 20b in source and drain regions. The As ion implantation is carried out by setting, for instance, an accelerating voltage of 40 keV and a doping level of $1 \times 10^{13}/cm^2$.

Figure 1E:
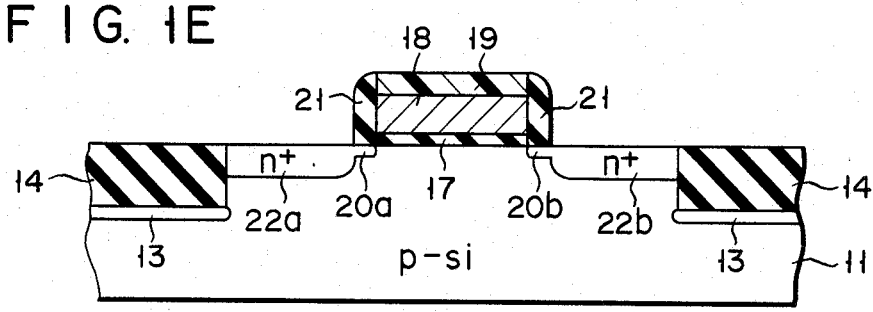

An insulating film 21 is selectively formed on both sides of the masking member 19 and gate electrode 18, as shown in FIG. 1E. This insulating film 21 is formed by forming a SiO$_2$ film to a thickness of 0.5 μm by CVD over the entire surface followed by etching of the entire surface by RIE using fluorocarbon. By this process, the insulating film 21 is left only on both sides of the masking member 19 and gate electrode 18. Subsequently, phosphorus ions (P$^+$) are implanted at an accelerating voltage of 200 keV and a doping level of $8 \times 10^{13}/cm^2$ thereby forming deeply doped n$^+$-type layers 22a and 22b in the source and drain regions. Thus, a so-called LDD (lightly doped drain) structure is obtained, which has the lightly doped n$^-$-type layers 20a and 20b near the gate region and also has deeply doped n$^+$-type layers 22a and 22b of high impurity concentration in regions spaced apart from the gate region.

Figure 1F:
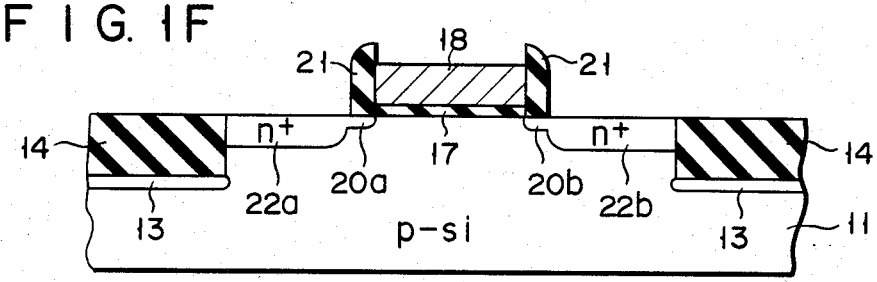

The masking member 19 is removed to expose the gate electrode 18, as shown in FIG. 1F. The insulating film 21 is left upwardly projecting on both sides of the gate electrode 18 as is shown.

Figure 1G:
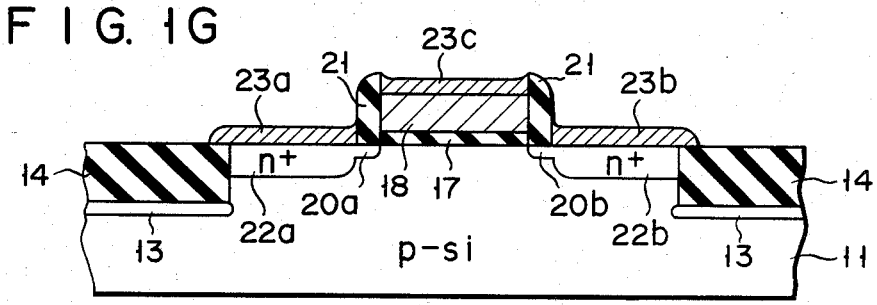
Figure 2:
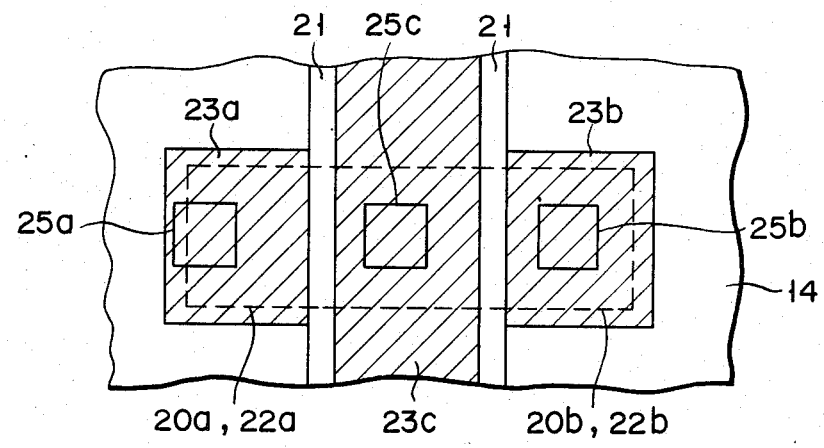
FIG. 2 is a plan view showing the structure shown in FIG. 1G.

Conductive material films 23a, 23b and 23c are selectively formed by CVD on the source and drain regions and gate electrode 18, as shown in FIG. 1G. The selective CVD is carried out using tungsten fluoride (WF$_6$) gas and H$_2$ gas. By this CVD, a tungsten (W) film is formed as the conductive material films 23a to 23c only on the exposed surface of the silicon substrate 11 and gate electrode 18. The conditions of the CVD are suitably set so that the tungsten film extends from the source and drain regions to the adjacent field region at the same level to an extent corresponding to its thickness. As a preferable example of the conditions of the selective CVD, the substrate temperature is set to 200° to 700° C., the flow rate of WF$_6$ gas is set to 1 to 20 ml/min., the flow rate of H$_2$ is set to 10 to 1,000 ml/min, and the reaction tube's inner pressure is set to be 5 Torr or below. When the CVD is carried out for a predetermined period under the above conditions to form a tungsten film of 500 Å as the conductive material films 23a to 23c, the conductive material films 23a and 23b on the source and drain regions overlay over the field region to an extent of approximately 500 Å. The conductive material film 23c on the gate electrode 18 is formed in a state buried between the opposing side insulating films 21. The conductive material film 23c on the gate electrode 18 is automatically separated from the conductive films 23a and 23b on the source and drain regions by the insulating films 21. FIG. 2 shows a plan view pattern of the structure having the conductive material films 23a to 23c formed in the above-mentioned.

Figure 1H:
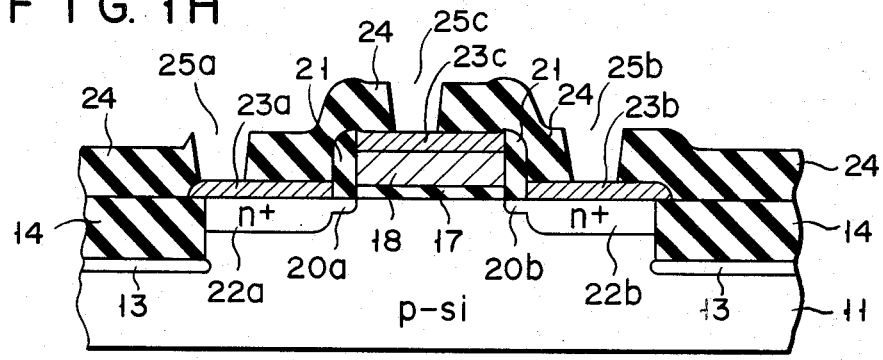
Figure 11:
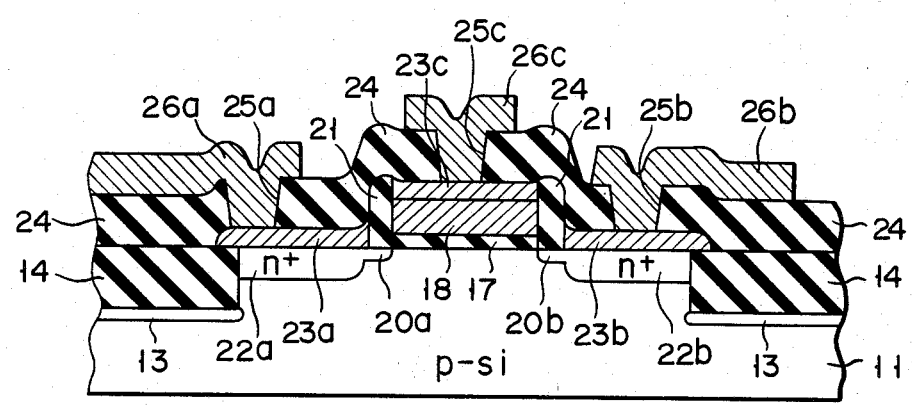

An insulating film 24 consisting of CVD SiO$_2$ is formed on the entire wafer surface, and contact holes 25a to 25c are formed by RIE in the insulating film 24, as shown in FIG. 1H. In this example, the contact holes 25a to 25c are formed in deviated positions as a whole toward the source region due to a mask alignment error, as is clearly seen from FIGS. 1H and 2. More specifically, the contact hole 25a on the n$^+$-type layer 22a on the source region, is slightly deviated from the n$^+$-type layer 22a to overlay over the field region. However, the field insulating film 14 at the bottom of the contact hole 25a is not exposed because the field region is covered by the conductive material film 23a.

Aluminum is deposited to 0.8 μm by sputtering and patterned to form interconnection layers 26a to 26c. Therefore, an insulated gate type field-effect transistor (MOS device) is completed.

Figure 4:
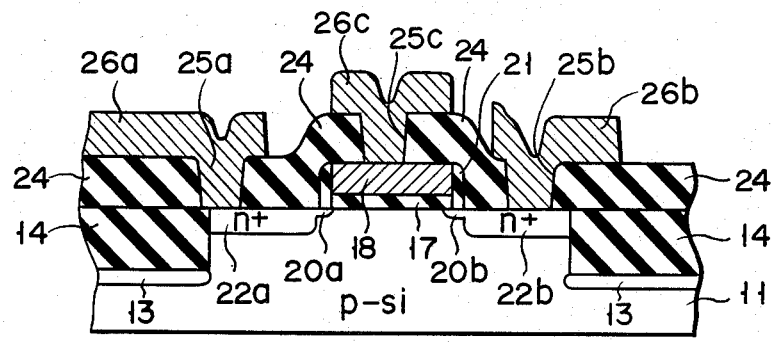
FIGS. 4 and 5 are views similar to FIG. 1I but respectively showing MOS devices fabricated by conventional processes.
Figure 5:
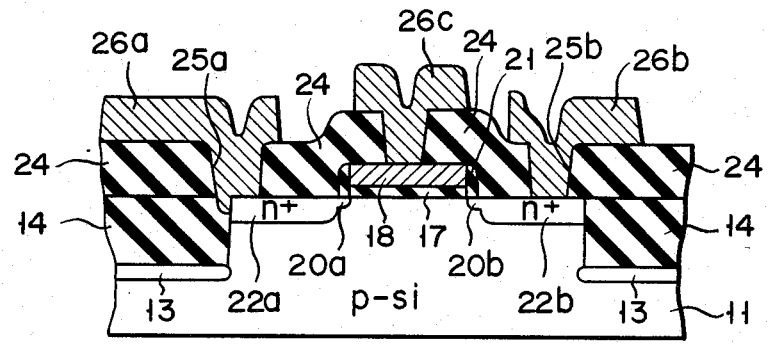

The above embodiment has the following advantages. FIG. 4 is a view similar to FIG. 1I but showing a MOS device fabricated by a conventional process. This structure does not have the conductive material films 23a to 23c shown in FIG. 1I. With this conventional process MOS device, if a contact hole alignment error occurs as in the above example, the area of contact between the interconnection layer 26a and n$^+$-type layer 22a will be less than the sectional area of the contact hole 25a, as is obvious from FIG. 4. In this case, the contact resistance between the interconnection layer 26a and n$^+$-type layer 22 is more than the calculated value. This is particularly pronounced when the contact hole is small. In contrast, with the above embodiment, it is possible to prevent the increase of the contact resistance between the interconnection layer 26a and n$^+$-type layer 22a in the case of a contact hole alignment error owing to the presence of the conductive material films 23a and 23b that extend up to the field region. In another aspect, with the conventional process, in which the conductive material films 23a to 23c are not formed, the insulating film 14 is locally etched due to possible overetching in the step of formation of the contact holes 25a to 25c, as shown in FIG. 5. As a result, a pn junction between the n$^+$-type layer 22a, on the side of which the field insulating film 14 is locally etched, and the substrate 11 would become defective. According to the invention, the conductive material films 23a and 23b will also serve as a stopper against overetching to prevent local etching of the field insulating film 14 according to a slight contact hole alignment error as is obvious from FIG. 1I. Thus, the generation of a defective pn junction can be prevented to ensure high reliability of the MOS device.

As shown in FIG. 1F, the insulating films 21 are left on two sides of the gate electrode 18. Their upper ends are positioned above the upper surface of the electrode 18. The films 21 function as barriers for preventing the conductive material films 23a and 23b from short circuiting to the conductive material film 23c. Where the upper ends of the films 21 provided in the same plane as the upper surface of the electrode 18, the film 23c would partially overlap the films 21. This is equivalent to partially forming the films 23a and 23b on the field insulating film 14, thus short circuiting films 23a and 23b to the film 23c. Even if this would not be a complete short circuit, it would increase the leakage current flowing between the films 23a and 23b on the one hand and the film 23c on the other hand.

In the present invention, the upper ends of films 21 could be positioned at any desired level above the upper surface of the gate electrode 18 by controlling the thickness of the masking member 18. Since the upper ends of the films 21 are above the upper surface of the electrode 18, an electrical isolation is ensured between the films 23a and 23b, on the one hand and the film 23c on the other hand.

Figure 3:
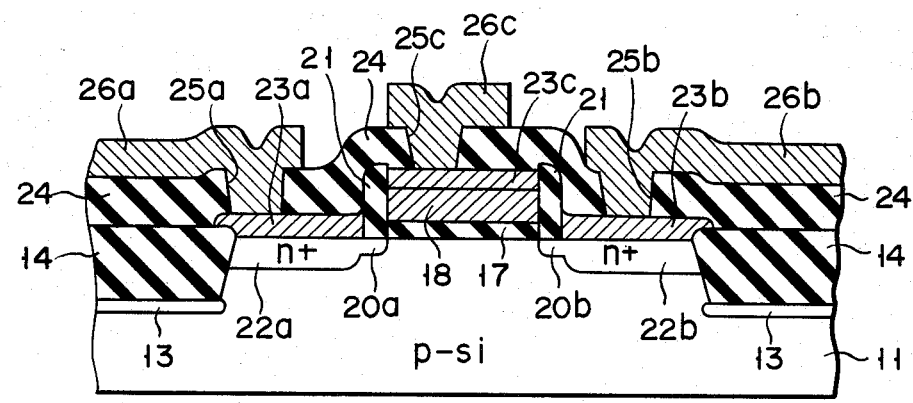
FIG. 3 is a view similar to FIG. 1I but showing a MOS device obtained by a different embodiment of the invention.

FIG. 3 is a view similar to FIG. 1I but showing a MOS device obtained by a different embodiment of the invention. The field insulating film 14 is formed not by the burying method but by a so-called LOCOS method. The rest of the process is the same as in the preceding embodiment. In this embodiment, the field region of the substrate 11 is preliminarily etched to a predetermined depth, and then the field insulating film 14 is formed by thermal oxidation at a high temperature. Based on the LOCOS method, like the previous embodiment, the selective CVD conductive material films 23a and 23b may be formed such that there partly overlay over the field insulating film 14 so long as the surface of the substrate 11 in the source and drain regions is substantially at the same level as the surface of the field insulating film 14. Thus, the same advantages as in the previous embodiment can be obtained with this embodiment.

The above embodiments of the invention are by no means limitative, and the invention covers the following.

As the deposition of the conductive material film may be used, in addition to the selective CVD using the $WF_6$ gas and $H_2$ gas, a selective CVD process uses another refractory metal halide gas and $H_2$ gas. For example, a tungsten film may be deposited by selective CVD using tungsten chloride ($WCl_6$) gas and $H_2$ gas. Further, it is possible to use a fluoride or a chloride of a refractory metal such as molybdenum (Mo), niobium (Nb), tantalum (Ta) and titanium (Ti) as well as tungsten (W). When the above material gases are used, the conditions of the selective CVD may again be set as noted above, e.g., the substrate temperature is 200° to 700° C., refractory metal halide gas flow rate is 1 to 20 ml/min., the $H_2$ gas flow rate is 10 to 1,000 ml/min. and the reaction tube's inner pressure is 5 Torr or below. Under these conditions, the conductive material film of 500 Å or above may be formed such that it partly overlays over the insulating film adjacent to the source and drain regions to an extent corresponding to its thickness.

The selective CVD conductive material film may use a refractory metal silicide. In this case, the selective CVD may be carried out using a refractory metal halide gas, a gas containing silicon (Si), e.g., $SiH_4$ or $SiH_2Cl_2$, and $H_2$ gas. Again, a conductive material film of 500 Å formed under the same conditions as noted above will overlay over the field insulating film adjacent to the source and drain regions to an extent corresponding to its thickness.

The invention is applicable to complementary MOS (CMOS) devices as well as p-channel MOS devices.

What is claimed is:

1. A method of fabricating an insulated gate type field-effect transistor, comprising the steps of:
   forming a gate electrode on a gate insulating film and patterned by selective etching using a masking member, said gate insulating film being formed on a semiconductor region of a substrate surrounded by a field insulating film;
   forming source and drain regions aligned to said gate electrode by doping impurities into the semiconductor region;
   forming a first insulating film on the entire surface of the substrate by chemical vapor depositon;
   etching the first insulating film by reactive ion etching, except for the portions of the first insulating film that are formed on both sides of a laminate consisting of the masking member and the gate electrode;
   removing said masking member, thereby exposing said gate electrode;
   forming conductive material films by selective chemical vapor deposition on the exposed surfaces of said gate electrode, said source and drain regions and regions surrounding said source and drain regions extending onto said field insulating film;
   forming a second insulating film on the entire surface of the substrate including said conductive material films;
   forming contact holes in those portions of said second insulating film which are positioned above said gate electrode and said source and drain regions; and
   forming interconnection layers contacting said conductive material films exposed through said contact holes.

2. The method according to claim 1, wherein said conductive material films formed by the selective chemical vapor deposition consist of a refractory metal film of 500 Å or above formed by chemical vapor deposition using a refractory metal halide gas and $H_2$ gas.

3. The method according to claim 1, wherein said conductive material films formed by the selective chemical vapor deposition consist of a refractory metal film of 500 Å or above formed by chemical vapor deposition using a refractory metal halide gas, a gas containing silicon and $H_2$ gas.

4. The method according to claim 1, wherein said field insulating film is buried in the substrate such that its surface is substantially at the same level as the surface of an element formation region of the semi-conductor substrate.

* * * * *